(12) United States Patent
Chow et al.

(10) Patent No.: US 7,009,487 B1
(45) Date of Patent: Mar. 7, 2006

(54) FABRICATION OF NANO-SCALE TEMPERATURE SENSORS AND HEATERS

(75) Inventors: Lee Chow, Orlando, FL (US); Dan Zhou, Orlando, FL (US); Fred Stevie, Raleigh, NC (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 0 days.

(21) Appl. No.: 10/764,242

(22) Filed: Jan. 23, 2004

Related U.S. Application Data

(62) Division of application No. 10/084,688, filed on Feb. 27, 2002, now Pat. No. 6,905,736.

(60) Provisional application No. 60/272,155, filed on Feb. 28, 2001.

(51) Int. Cl.
*H01C 3/04* (2006.01)

(52) U.S. Cl. ........................................ 338/25; 338/333

(58) Field of Classification Search .................. 338/25, 338/47, 111, 114, 224, 333; 374/179; 427/564; 264/614, 618, 619
See application file for complete search history.

(56) References Cited

U.S. PATENT DOCUMENTS

| | | | | |
|---|---|---|---|---|
| 3,954,507 A | * | 5/1976 | Carter | 136/233 |
| 5,411,600 A | * | 5/1995 | Rimai et al. | 136/225 |
| 5,510,098 A | | 4/1996 | Chow | 423/455 B |
| 5,581,083 A | | 12/1996 | Majumdar et al. | 250/306 |
| 5,838,005 A | | 11/1998 | Majumdar et al. | 250/306 |
| 6,037,645 A | * | 3/2000 | Kreider | 257/467 |
| 6,163,061 A | * | 12/2000 | Iida | 257/467 |
| 6,182,509 B1 | * | 2/2001 | Leung | 73/514.05 |
| 6,215,137 B1 | * | 4/2001 | Suzuki et al. | 257/254 |
| 6,367,970 B1 | * | 4/2002 | Danielson | 374/43 |
| 6,433,310 B1 | * | 8/2002 | Wickramasinghe et al. | 219/216 |
| 6,757,235 B1 | * | 6/2004 | Wickramasinghe et al. | 369/99 |

FOREIGN PATENT DOCUMENTS

JP  2000-205969  * 7/2000

OTHER PUBLICATIONS

English machine translation to 2000-205969, Kobayashi patent above, Jul. 2000.*

* cited by examiner

*Primary Examiner*—Tu Hoang
(74) *Attorney, Agent, or Firm*—Brian S. Steinberger; Law Offices of Brian S. Steinberger, P.A.

(57) ABSTRACT

The method for the fabrication of nano scale temperature sensors and nano scale heaters using focused ion beam (FIB) techniques. The process used to deposit metal nano strips to form a sensor is ion beam assisted chemical vapor deposition (CVD). The FIB $Ga^+$ ion beam can be used to decompose $W(CO)_6$ molecules to deposit a tungsten nano-strip on a suitable substrate. The same substrate can also be used for Pt nano-strip deposition. The precursors for the Pt can be trimethyl platinum $(CH_3)_3Pt$ in the present case. Because of the $Ga^+$ beam used in the deposition, both Pt and W nano-strips can contain a certain percentage of Ga impurities, which we denoted as Pt(Ga) and W(Ga) respectively. Our characterization of the response of this Pt(Ga)/W(Ga) nano scale junction indicates it has a temperature coefficient of approximately 5.4 mV/° C. This is a factor of approximately 130 larger than the conventional K-type thermocouples.

11 Claims, 5 Drawing Sheets

FABRICATION OF NANO-SCALE TEMPERATURE SENSORS AND HEATERS

This is a Divisional of application Ser. No. 10/084,688 filed Feb. 27, 2002 now U.S. Pat. No. 6,905,736, and this invention relates to nano scale temperature sensors and heaters, their method of fabrication and apparatus for doing so and claims the benefit of priority to U.S. Provisional Application Ser. No. 60/272,155 filed on Feb. 28, 2001.

BACKGROUND AND PRIOR ART

As semiconductor devices continue to decrease in size and more and more applications have been found for the micro and nano-devices, there is an urgent need for measuring physical quantities at sub-micrometer or even nanometer size dimension. Temperature is one of the fundamental physical quantities that routinely needs to be measured in order to derive other thermodynamic quantities such as heat, energy, or specific heat capacity.

Presently temperature can be measured using a thermocouple, a semiconductor diode, a metallic resistor, a thermister, an infrared thermometry, a near-field thermometry, and other more exotic methods. Each technique has its own advantages and disadvantages. For example, the thermocouple is extremely simple in design and inexpensive, while the semiconductor diode is not suitable for high temperature but used extensively to measure cryogenic temperature. The spatial resolution of most of the above techniques is about 10 microns, except for the near field thermometry in which the spatial resolution can be in the order of 50 nm. But near field thermometry involves complicated optical instrumentation and is very cumbersome. There are several efforts to improve the spatial resolution of temperature measurements by combining scanning tunneling microscopy (STM) or atomic force microscopy (AFM) with a small thermocouple or thermistor tip. U.S. Pat. No. 5,581,083 to Majumdar et al, described a method of fabricating nanometer hole on the tip of a scanning probe. The size of the holes define the area of interaction of the sensor with the environment. In U.S. Pat. No. 5,838,005, Majumdar et al extended the above patent to include using focus ion beam for fabricating the nano scale holes. However, it should be noted that the size of their sensors is still limited by the lithographic technique used. In addition, thermoelectricity of certain bulk materials drop drastically due to the constricted geometry of the AFM tip arrangement.

It would be very important to develop a much smaller sensor and a process by which the size of said sensor can be controlled to a nano size as small as 50 nm.

SUMMARY OF THE INVENTION

The first objective of the present invention is to provide a method of producing a sensor with sub-micron and/or nanometer dimension.

The second objective of this invention is to provide a method of producing a temperature sensor with a very high sensitivity.

The third objective of this invention is to provide a method of producing a nano scale heater.

A preferred embodiment of the invention is the preparation of a nano-scale sensor comprising the steps of: depositing a first metal nano-strip preferably of tungsten, on an electrical insulator substrate by means of a FIB deposition process; and then depositing a second metal nano-strip preferably platinum, on the same said substrate by mean of said FIB process in a partially overlapping fashion on said first metal to provide a sensing junction as said overlap.

The invention also includes a nano-scale sensing device, preferably a thermocoupler and a nano sensor, having the combination of: partially overlapping separate nano-strips of first W and Pt; an electrical insulator onto which said partially overlap nano-strips are deposited; an output electrode connected to the W nano-strip; and, a second output electrode electrically separate from said first electrode is connected to the Pt nano-strip.

In preferred embodiments, the first metal nano sized strip and the second metal nano sized strip each can include a thickness(diameter) of approximately 50 nm and a bi-metal sensing junction therebetween that can include a cross-sectional area of approximately 50×50 $nm^2$.

Further objects and advantages of this invention will be apparent from the following detailed description of the presently preferred embodiments which are illustrated schematically in the accompanying drawings.

DESCRIPTION OF THE PREFERRED EMBODIMENT

Figure 1A:
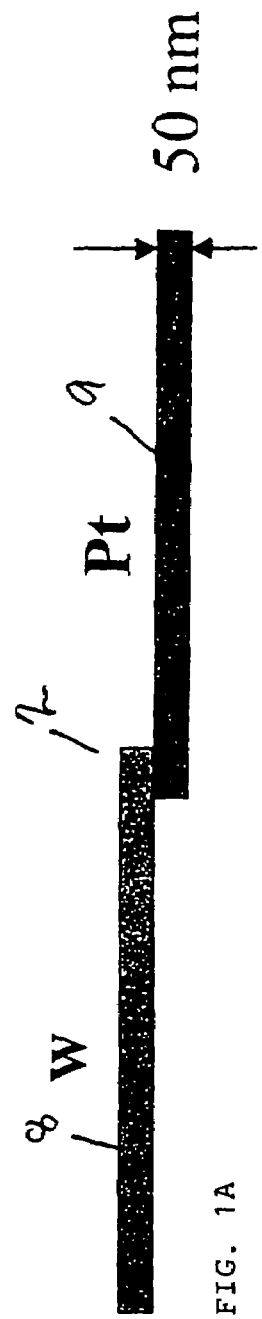
FIG. 1(a) shows a cross section of an overlapped nano-scale sensor configuration of the invention.

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

The method of the invention is based on the discovery that it is possible to create a nano-scale temperature sensor by a FIB (Focused Ion Beam) technique in which the separate nano-strips of W and Pt are deposited onto a substrate through a FIB deposition process. The junction of W and Pt nano-strips formed during the FIB process acts as a nano-scale temperature sensor. The diameters of the W and Pt nano-strips will be on the order of approximately 50 nm, and the cross-sectional area of W/Pt junction will be on the order of approximately 50×50 $nm^2$, which will be the smallest temperature sensors that can be made so far. The ends of the nano-strips can be deposited each onto larger conductive surfaces that would be connected to a sensing unit. Notice that the junctions can be made from different materials, and can also have different configurations, e.g., meet at a point or overlap layers of each of the nano-strips. Pt and W have been employed in this invention because they can easily be deposited using commercially available deposition instrumentation.

In a preferred embodiment, we fabricate the sensor contact using a focused ion beam technique FIB. The fabrication of a bi-metal junction on a suitable substrate will be carried out with a focused ion beam system, such as but not limited to the FEI 611 or FEI 200 TEM FIB system. For the tungsten nano-strip deposition, a feed gas of tungsten [W(CO)$_6$] is used as the tungsten precursors for the FIB CVD (chemical vapor deposition) process. A CVD process is described in U.S. Pat. No. 5,510,098 to the same inventor and assignee of the subject invention which is incorporated by reference. The feed gas is admitted into the FIB chamber through a local nozzle. The nozzle is approximately 100 $\mu$m from the surface during the deposition procedure. W(CO)$_6$ molecules are absorbed on the surface, bombarded by the Ga$^+$ ion beam, and decomposed. As a result, tungsten metal with approximately the dimension of the ion beam is deposited onto the substrate. The size of the nano-strip is primarily limited by the resolution of the FIB system used. After the deposition of the tungsten nano-strip, the same substrate can be used for the platinum nano-strip deposition. The precursors for the Pt metal deposition will be trimethyl platinum (CH$_3$)$_3$Pt in the present case. More than one FIB system can be used for the depositions. The FEI 611 has a minimum spot size of approximately 50 nm. The FEI 200TEM FIB system has a minimum beam spot size of approximately 7 nanometer and can be used to trim the deposition materials or substrates with a approximately 7 nm resolution. The minimum width of the as-deposited metal strip is approximately 100 nm, but can be trimmed using the Ga$^+$ beam after the final deposition.

The fabrication process can be used to prepare a heater or a different sensor. The resistive segment of the heater can be made up of alternating segments of two different FIB deposited metals. Because the deposited metals are not pure, but contain some Ga and other contaminants, the deposited metal will have a resistivity that will permit heating when an electric current is passed through the metal. The ability of the FIB to mill or deposit at high lateral resolution permits the preparation of site specific sensors or heaters. Sensors or heaters can then be adapted, for example, to micro-electromechanical system (MEMS), even as part of the MEMS fabrication process with the structure of substantially that of FIG. 3.

Figure 1B:
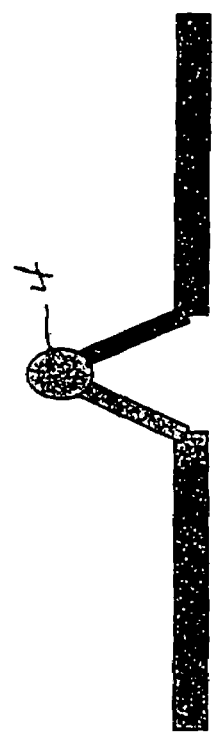
FIG. 1(b) shows a cross section of a ball shape junction sensor configuration of the invention.
Figure 1C:
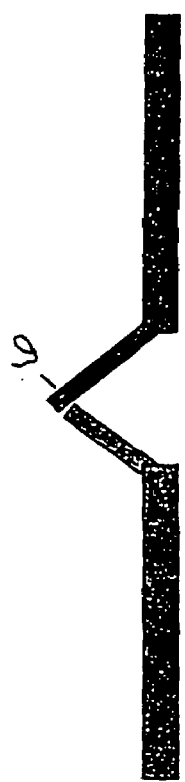
FIG. 1(c) shows a cross section of a point junction sensor configuration of the invention.

Reference should now be made to FIGS. 1 (a)–(c) that show cross sections of three different thermocouple junction configurations, i.e., overlapped 2, ball shaped 3 and a point 6, of the invention all are of nano sensor metals noted as tungsten 8 and platinum 9. The overlapping configurations can be used as appropriate for the sensors.

Figure 2:
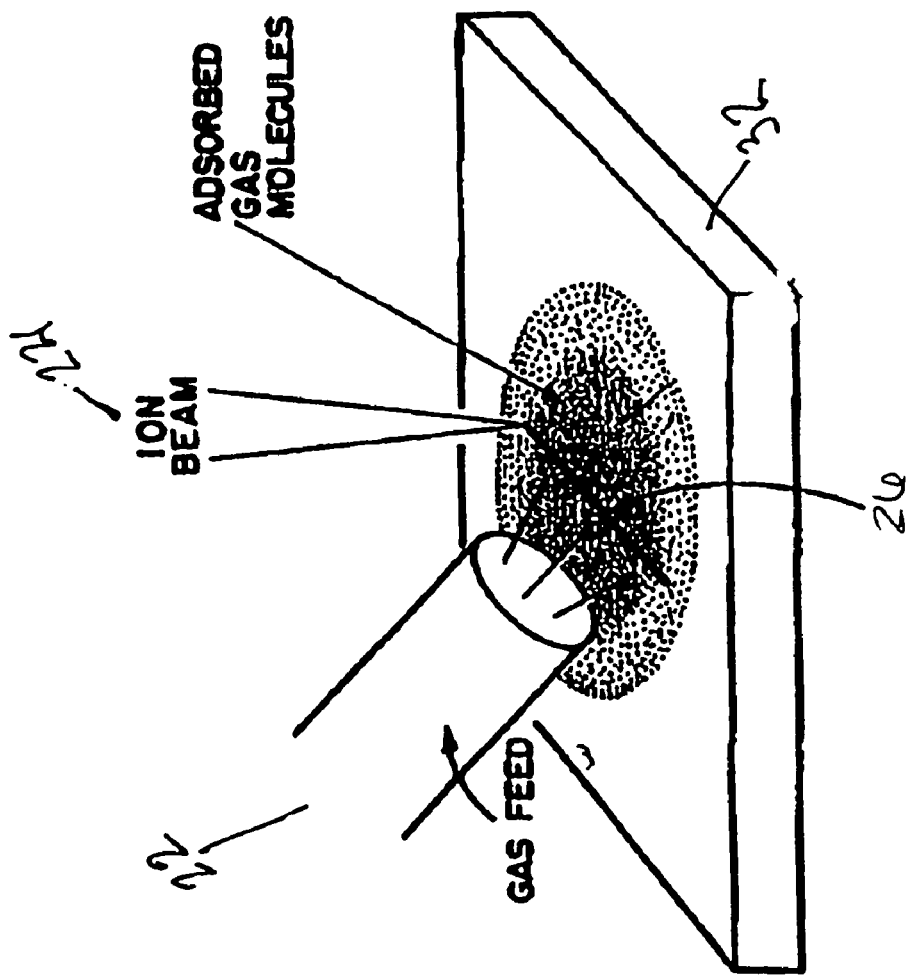
FIG. 2 shows experimental setup for deposition of metal strips with $Ga^+$ focused ion beam.

Reference should now be made to FIG. 2 that shows a schematic diagram of the focused ion beam assisted chemical vapor deposition system used in the process of making the supported nano-scale temperature sensors and heaters of the invention. During the FIB assisted chemical deposition 22, Ga$^+$ will be used as the ion beam 24, and W(CO)$_6$ and (CH$_3$)$_3$Pt will be employed as the gas precursors for W and Pt depositions 26, respectively onto the substrate 32. The metal nano-strip deposit can be formed where the Ga$^+$ ion beam 28 is scanned. Therefore, the different temperature sensor configurations of the invention can be made through this FIB assisted chemical vapor deposition experimental setup. Finally, the dimensions of the temperature sensors can be trimmed down to the nanometer scale.

Figure 3:
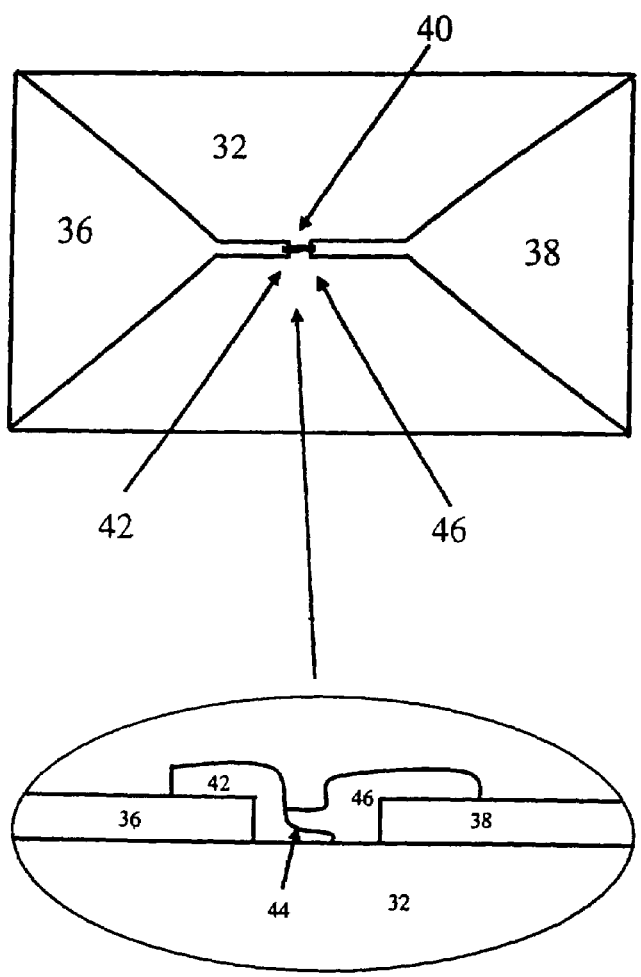
FIG. 3 shows Nano-scale sensor for testing or generating a temperature response.

Reference should now be made to FIG. 3 that shows the nano-scale sensor apparatus for temperature measurement. This apparatus is positioned on an electrical insulator 32 usually of glass, onto which has been deposited a conducting pattern that consists of electrodes 36 and 38 spaced apart by a very narrow gap 40. A nano strip 42 of tungsten is deposited in the requisite overlap portion 44 onto nano strip 46 of platinum. The data obtained from this apparatus is displayed in FIG. 5.

Figure 4:
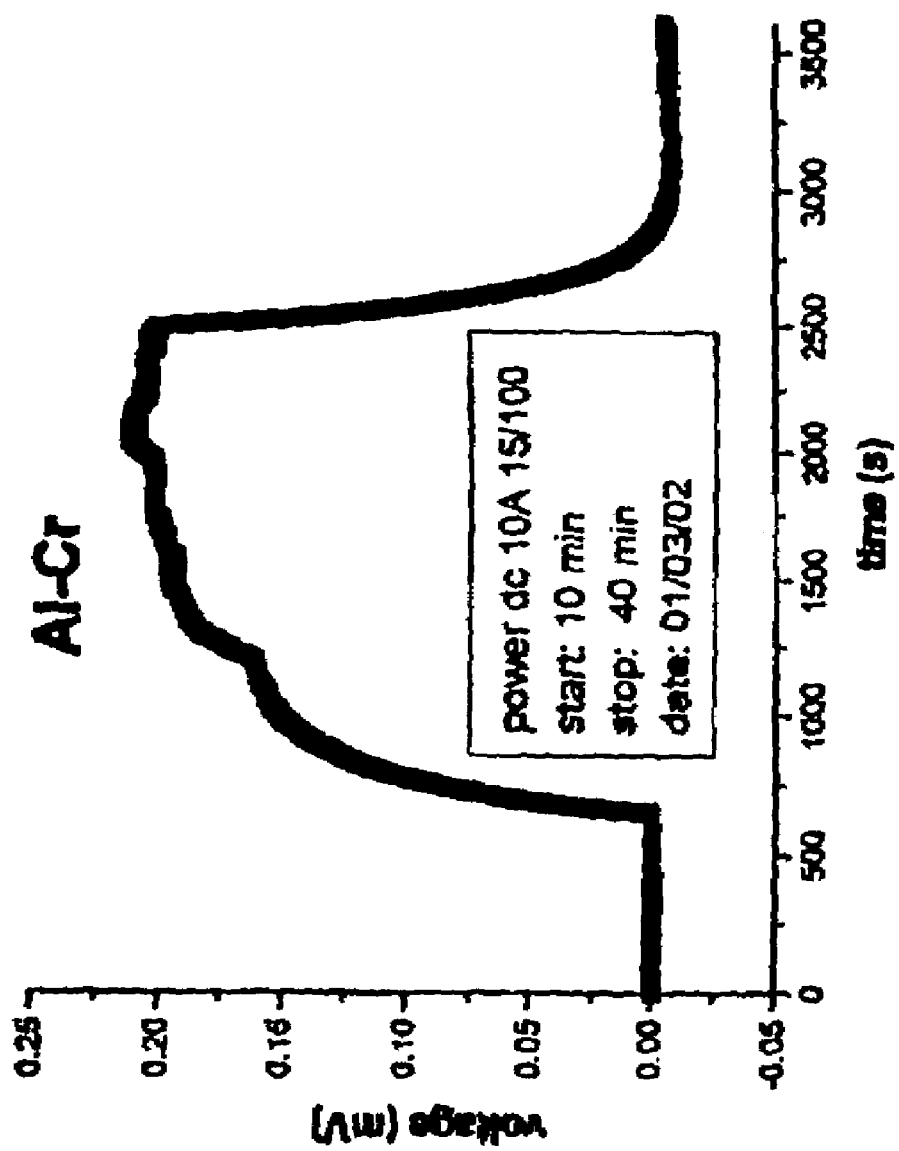
FIG. 4 shows a typical K-type thermocouple response to a temperature change of 6° C.

Reference should now be made to FIG. 4 that shows the actual temperature responses of a K-type thermocouple. This data should be compared with FIG. 5 and shows the actual temperature response of the nano scale sensor of the invention.

As noted above, FIG. 4 is the temperature response of a conventional K-type thermocouple which consists of a Chromel Alumel junction. One can see from this data that the sensitivity of the K-type thermocouple is approximately 0.04 mV/degree Centigrade (° C.).

Figure 5:
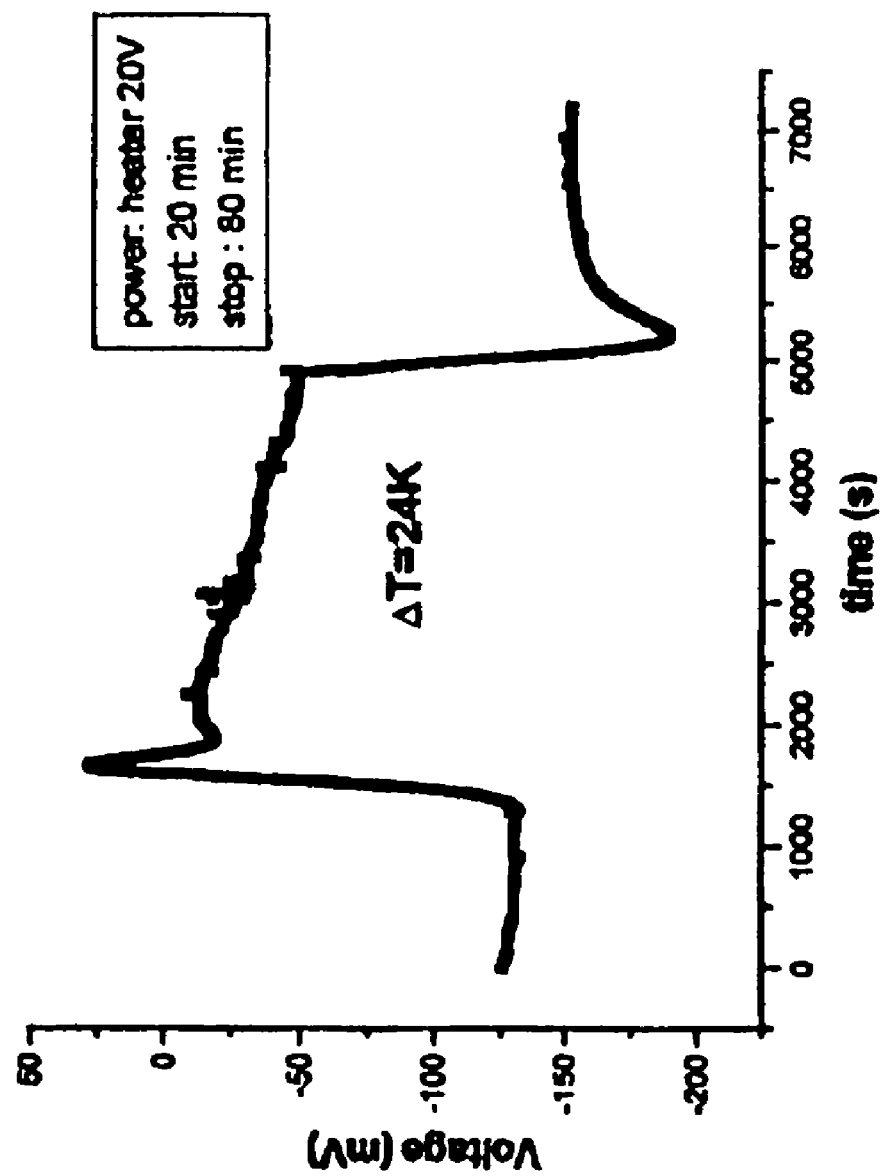
FIG. 5 shows the response of nano-scale temperature sensor to a 24° C. temperature change.

Now if you compare the K-type data of FIG. 4 with the data provided by the new FIB fabricated nano-sensor of FIG. 5, it is found that the sensitivity of the nano sensor is much higher. In FIG. 5, approximately 24° C. temperature change results in a voltage change of approximately 125 mV. This is a sensitivity factor approximately 130 times more than the conventional thermocouple. Thus, this extraordinarily enhanced sensitivity of the nano sensor of the invention is shown.

The advantage of the invention is that the nano scale dimension of the sensors can be precisely controlled through the FIB deposition process, which can be as small as a few tens of nanometer. This will enable measurement of the temperature from the subjects with different dimensions in a nanometer or a sub-micrometer range. The possible uses of the invention could be microelectronics industries or nanotechnology industries. Also the nano-sensor is site specific, meaning that it can be locate precisely at almost any solid. Furthermore, the nano sensor is less intrusive and can be used in medical applications, e.g., to measure the temperature of a single cell. Note further that existing thermocouples are much larger (orders of magnitude) than the nano-sensor disclosed herein.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A nano-scale sensor comprising in combination:
   (a) separate nano-strips of W and Pt having a partially overlapping portion with one another, the partially overlapping portion being selected from one of a ball-shaped portion, and a point shaped configuration, wherein the separate nano strips each include a thickness of approximately 50 nm wherein the partially overlapping portion includes: a bi-metal sensing junction having a cross-sectional area of approximately 50×50 nm$^2$;
   (b) an electrical insulator onto which said partially overlapping portion of the nano-strips are deposited:
   (c) a first output electrode connected to the W nano-strip; and,
   (d) a second output electrode which is electrically separate from the first output electrode connected to the Pt nano-strip.

2. The sensor of claim 1 wherein said insulator is glass.

3. The sensor of claim 1 wherein at least one of said electrode includes: Al.

4. The sensor of claim 1 wherein the nano-strips of W and Pt contain gallium.

5. The sensor of claim 4 wherein said nano-strips are trimmed.

6. A nano sized sensor comprising:
- a first metal nano sized strip on an electrical insulator substrate;
- a second metal nano sized strip on said substrate, the second metal nano sized strip being a different metal material from the first nano sized strip, the first metal nano sized strip and the second metal nano sized strip each include a thickness of approximately 50 nm; and
- a bi-metal sensing junction having a ball-shaped portion that is formed between a portion where the first metal nano sized strip meets a portion of the second metal nano sized strip, the bi-metal sensing junction having a cross-sectional area of approximately 50×50 nm$^2$.

7. The sensor of claim 6, wherein one of the first metal nano sized strip and the second nano metal sized strip is W(tungsten) and another of the first metal nano sized strip and the second nano sized strip is Pt(platinum).

8. The sensor of claim 6, wherein the sensor includes:
- a thermo couple for sensing temperature at the bi-metal junction.

9. A nano sized sensor comprising:
- a first metal nano sized strip on an electrical insulator substrate;
- a second metal nano sized strip on said substrate, the second metal nano sized strip of a different metal material from the first nano sized strip, the first metal nano sized strip and the second metal nano sized strip each include a thickness of approximately 50 nm;
- a bi-metal sensing junction having a point shaped configuration portion formed between a portion between the first metal nano sized strip and the second metal nano sized strip, the bi-metal sensing junction includes a cross-sectional area of approximately 50×50 nm$^2$.

10. The sensor of claim 9, wherein one of the first metal nano sized strip and the second nano metal sized strip is W(tungsten) and another of the first metal nano sized strip and the second nano sized strip is Pt(platinum).

11. The sensor of claim 9, wherein the sensor includes:
- a thermo couple for sensing temperature at the bi-metal junction.

* * * * *